US008780561B2

(12) United States Patent
Danello et al.

(10) Patent No.: US 8,780,561 B2
(45) Date of Patent: Jul. 15, 2014

(54) CONDUCTION COOLING OF MULTI-CHANNEL FLIP CHIP BASED PANEL ARRAY CIRCUITS

(75) Inventors: Paul A. Danello, Franklin, MA (US); Richard A. Stander, Chelmsford, MA (US); Michael D. Goulet, Southbridge, MA (US)

(73) Assignee: Raytheon Company, Waltham, MA (US)

(*) Notice: Subject to any disclaimer, the term of this patent is extended or adjusted under 35 U.S.C. 154(b) by 189 days.

(21) Appl. No.: 13/434,992

(22) Filed: Mar. 30, 2012

(65) Prior Publication Data

US 2013/0258599 A1    Oct. 3, 2013

(51) Int. Cl.
*H05K 7/20* (2006.01)
*H01L 21/50* (2006.01)
*H01L 21/00* (2006.01)

(52) U.S. Cl.
USPC ...... 361/706; 361/679.54; 361/704; 361/709; 361/715; 361/719; 257/E21.499; 257/704; 257/713; 438/106; 438/107; 438/110; 438/122; 29/830; 29/841

(58) Field of Classification Search
USPC ............ 361/679.46, 679.54, 690–697, 361/700–712, 715–724; 165/80.2, 80.3, 165/104.33, 185; 257/686, 698, 666, 667, 257/668, 699, 700, 704, 706, 713, 718, 726, 257/777; 438/17, 110; 174/15.2, 16.3, 252; 29/825–856, 890.03, 890.032, 890.033
See application file for complete search history.

(56) References Cited

U.S. PATENT DOCUMENTS

| | | | |
|---|---|---|---|
| 5,240,552 A | 8/1993 | Yu et al. | |
| 5,646,828 A | 7/1997 | Degani et al. | |
| 5,777,847 A * | 7/1998 | Tokuno et al. | 361/705 |
| 5,844,310 A | 12/1998 | Okikawa et al. | |
| 5,886,408 A | 3/1999 | Ohki et al. | |
| 5,980,363 A * | 11/1999 | Meikle et al. | 451/41 |
| 6,032,362 A | 3/2000 | Okikawa et al. | |
| 6,284,574 B1 | 9/2001 | Petrarca et al. | |

(Continued)

FOREIGN PATENT DOCUMENTS

JP     06224334     8/1994

OTHER PUBLICATIONS

Empfasis, MMIC Device Development in Radar Applications, Mar. 2004, www.empf.org/empfasis/mar04/mmic.htm, 3 pages.

(Continued)

*Primary Examiner* — Michail V Datskovskiy
(74) *Attorney, Agent, or Firm* — Daly, Crowley, Mofford & Durkee, LLP

(57) ABSTRACT

A method of forming a heat-dissipating structure for semiconductor circuits is provided. First and second semiconductor integrated circuit (IC) chips are provided, where the first and second semiconductor chips each have first and second opposing sides, wherein the first and second semiconductor IC chips are configured to be fixedly attached to a top surface of a substantially planar circuit board along their respective first sides. The respective second opposing sides of each of the first and second semiconductor IC chips are coupled to first and second respective portions of a sacrificial thermal spreader material, the sacrificial thermal spreader material comprising a material that is thermally conductive. The first and second portions of the sacrificial thermal spreader material are planarized to substantially equalize a respective first height of the first semiconductor chip and a respective second height of the second semiconductor chip.

20 Claims, 7 Drawing Sheets

(56) References Cited

U.S. PATENT DOCUMENTS

| | | | |
|---|---|---|---|
| 6,653,730 B2* | 11/2003 | Chrysler et al. | 257/704 |
| 6,784,522 B2* | 8/2004 | Murari et al. | 257/666 |
| 6,918,178 B2* | 7/2005 | Chao et al. | 29/841 |
| 6,969,637 B2* | 11/2005 | Murari et al. | 438/113 |
| 7,031,162 B2* | 4/2006 | Arvelo et al. | 361/718 |
| 7,091,068 B1 | 8/2006 | Ahmed et al. | |
| 7,254,033 B2* | 8/2007 | Jafari et al. | 361/719 |
| 7,485,571 B2 | 2/2009 | Leedy | |
| 7,915,076 B2* | 3/2011 | Ogawa et al. | 438/106 |
| 7,975,377 B2* | 7/2011 | Kwon | 29/830 |
| 8,039,365 B2* | 10/2011 | Lee et al. | 438/462 |
| 8,564,957 B2* | 10/2013 | Usui et al. | 361/720 |
| 2003/0127715 A1* | 7/2003 | Liu et al. | 257/678 |
| 2003/0128518 A1* | 7/2003 | Gaynes et al. | 361/704 |
| 2005/0167802 A1* | 8/2005 | Hirano et al. | 257/678 |
| 2007/0080458 A1* | 4/2007 | Ogawa et al. | 257/750 |
| 2008/0142954 A1* | 6/2008 | Hu | 257/713 |
| 2008/0182366 A1* | 7/2008 | Ogawa et al. | 438/124 |
| 2011/0075377 A1 | 3/2011 | Paquette et al. | |
| 2011/0228485 A1 | 9/2011 | Usui et al. | |
| 2013/0214406 A1* | 8/2013 | Schultz | 257/713 |

OTHER PUBLICATIONS

Notification Concerning Transmittal of The International Search Report and The Written Opinion of the International Searching Authority, or the Dedaration dated Jun. 28, 2013, PCT/US2013/029557, 5 pages.

Written Opinion of the International Searching Authority, PCT/US2013/029557, Jun. 28, 2013, 10 pages.

* cited by examiner

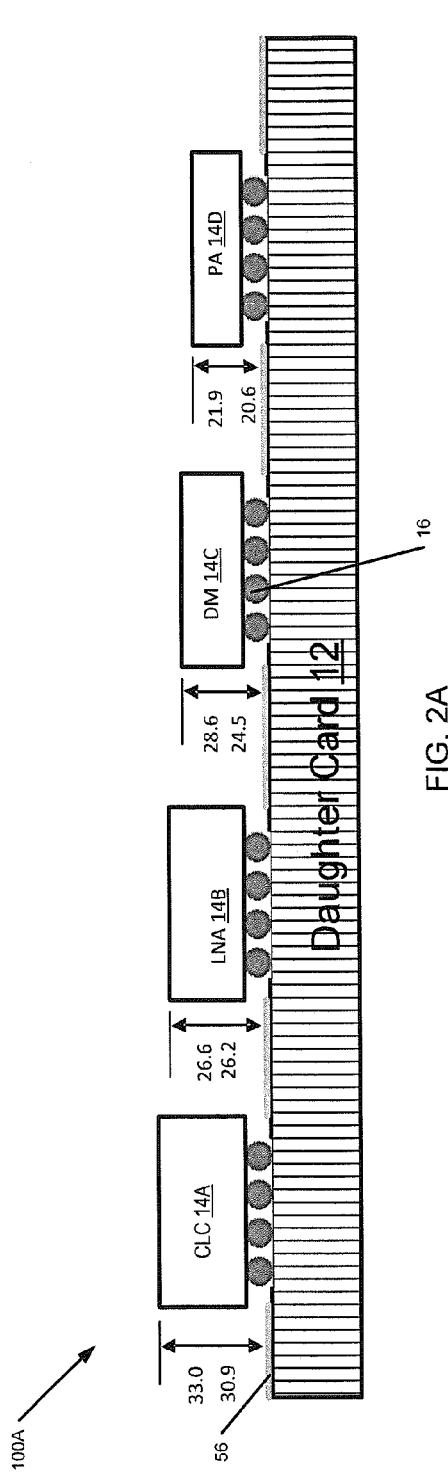
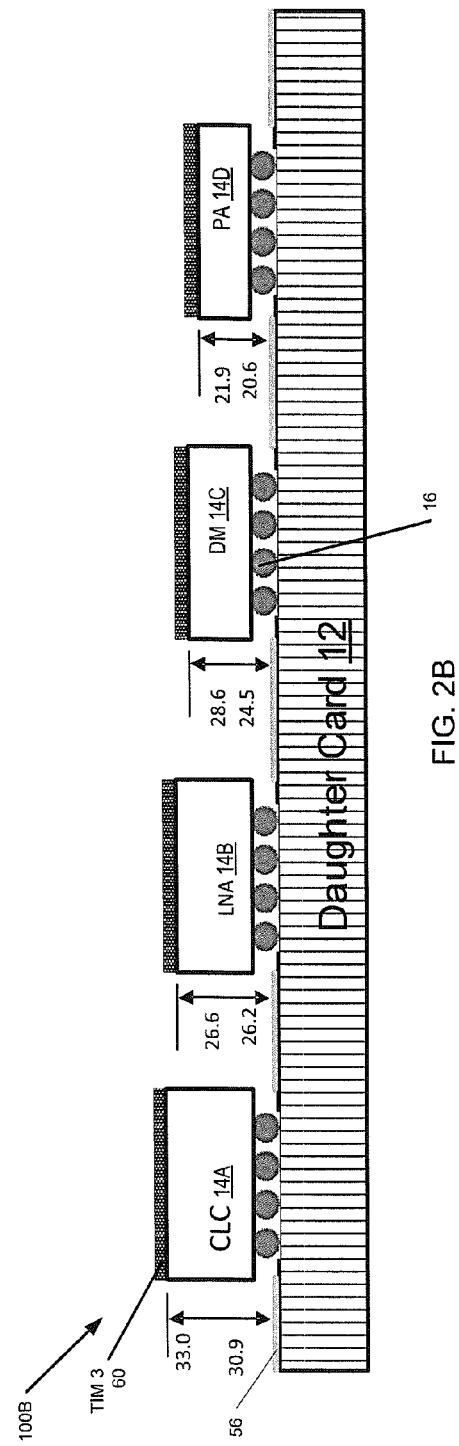
FIG. 2A
FIG. 2B

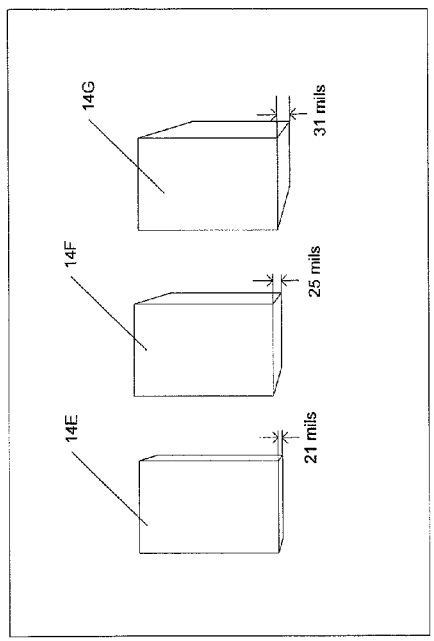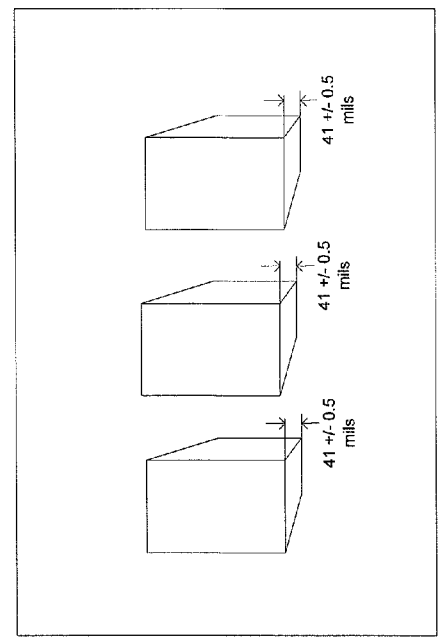

CONDUCTION COOLING OF MULTI-CHANNEL FLIP CHIP BASED PANEL ARRAY CIRCUITS

FIELD OF THE INVENTION

Embodiments of the invention generally relate to improving the thermal performance of devices such as flip chip based panel arrays. More particularly, the invention relates to devices and methods for assembling flip chip based panel arrays with minimal thermal gaps between the flip chips and heat spreaders.

BACKGROUND OF THE INVENTION

As those of skill in the art are aware, many different techniques can be used to provide cooling of electrical components. For example, circulation of air within a housing can be sufficient to cool some types of electrical components contained within the housing. Some electrical assemblies further include physical features (e.g., cooling fins, cooling manifolds) that increase the surface area exposed to convective air currents, or provide fans to circulate the air further, providing further cooling. This air cooling can be insufficient, however, for high power circuits and/or densely packed circuits.

High power and/or densely packed circuits can need additional heat dissipation, such as by mounting some or all of the electrical components to a thermal dissipation member such as a heat spreader, cold plate, cooling manifold, dissipater, evaporator, or other type of heat sink. The thermal dissipation member can, for example, be made using one or more materials having high thermal conductivity (e.g., metals such as copper and aluminum). The thermal dissipation member is able to conduct heat away from the electrical device and into the environment via contact between the thermal dissipation member and a structure designed to transfer the heat to the surrounding air or a liquid via conduction and convection. In some instances, a series of thermal dissipation members can work together to provide cooling.

Providing sufficient cooling for devices such as phased array antennas can present challenges. As is known in the art, a phased array antenna includes a plurality of antenna elements spaced apart from each other by known distances. Each of the antenna elements are typically coupled through a plurality of phase shifter circuits, amplifier circuits and/or other circuits to either or both of a transmitter or receiver. In some cases, the phase shifter, amplifier circuits and other circuits (e.g. mixer circuits) are provided in a so-called transmit/receive (T/R) module and are considered to be part of the transmitter and/or receiver.

The phase shifters, amplifier and other radio frequency (RF) circuits (e.g. T/R modules) are often powered by an external power supply (e.g. a DC power supply). Such circuits are referred to as "active circuits" or "active components." Accordingly, phased array antennas which include active circuits are often referred to as "active phased arrays." Active circuits dissipate power in the form of heat. Thus, it is necessary to cool active phased arrays so that the active circuits operate within a desired temperature range.

In active phased arrays having T/R channels which use relatively little power (e.g. less than about two Watts (W) average RF power), individual finned heat-sinks (or "heat-sinks") are sometimes attached to each active circuit in the channels. That is, each active circuit has an individual heat sink attached thereto. Although this approach may satisfy the cooling requirements for the active phased array, this approach to thermal management is limited to relatively low power density active phased array's because the temperature rise is the cooling air stream can result in excessive variations in temperature across the array which will negatively impact performance.

In relatively high power per T/R channel applications, especially applications involving a high density of computer processors (e.g., a central processor unit (CPU) chip every inch, in a ten foot diameter assembly) it is often necessary to use a liquid cooling approach to maintain such active circuits in their normal operating temperature range. The liquid cooling approach is accomplished by clamping the electronics to these liquid cooled coldplates. The mechanical/thermal interfaces between the heat generating devices (e.g. the active circuits) and heat sinking devices determines, at least in part, the cooling effectiveness of heat sinking devices.

Some RF systems, including active phased arrays, utilize so-called flip-chip mounted circuits. Removing heat from flip-chips, especially those in configurations such as panel arrays, can be difficult. Various techniques have been used to provide cooling, and advantageously the methods used provide a cooling solution that helps to compensate for the tolerance stack-up between the thickness of each chip (and type of chip) and the heat sink providing the cooling, and also compensate for the coefficient of thermal expansion (CTE) mismatch between the Circuit Card Assembly (containing the flip-chips) and the coldplate. A commonly used technique to remove heat from flip-chips is to dispose an elastomeric material, such as a compliant epoxy or a thermal gap-pad (also referred to as a thermal mat) between the exposed surface of the flip-chip and a surface of a heat sink. A thermal gap pad resembles a soft piece of rubber with thermally conductive material in it, e.g., a silicone, or an elastomeric material.

An illustrative example of a configuration using a thermal gap pad is shown in FIG. 1. FIG. 1 shows an example of a prior art assembly 10 that includes a daughter card 12 (e.g., a substrate), to which a plurality of flip chips 14A-14D are attached via a plurality of solder balls 16. A thermal interface material (TIM) 18, which in this example is a thermal gap pad 18 and a cooling manifold 20 are compressed against the chips 14A-14D. Typically, the thermal gap pad 18 is made from a polymeric material, which generally is not as highly thermally conductive as other types of materials. The illustrative dimension of the thermal gap pad 18 of FIG. 1 (i.e., 40 mils) shows hot such a thermal gap pad 18 is relatively thick as compared to the devices it surrounds. When the cooling manifold and thermal gap pad 18 are compressed against the chips 14, the thermal gap pad 18 forms around the chips 14 to create a thermally conductive path.

The thermally conductive path in the assembly 10 of FIG. 1 generally runs from the side of the flip chips 14 adjacent to the solder balls 16, up through the chip, through the thermal gap pad 18, and to (and through) the cooling manifold 20. The largest constituent of that thermally conductive path is the thermal gap pad 18, with a thermal conductivity only on the order of 1-3 Watts/meter/degree-K. This thermal performance can be very limiting in some applications and limits the thermal performance of any module in which the flip chips 14 are a part, as well as the amount of power that could be used with such a module.

In the prior art configuration of FIG. 1, the gap-pad 18 needs to be compliant in compression and shear to compensate for coplanarity tolerances from chip-to-chip and in-plane movement, due to coefficient of thermal expansion (CTE) mismatch between the flip-chip 14, circuit board 12 and heat sink/cooling manifold 20 as well as vibration between the circuit board 12 on which the flip-chip circuit 14 is mounted and the heat sink/cooling manifold 20. The gap-pad technique can result in a thermal path having poor bulk thermal conductivity. Furthermore, the gap-pad approach results in thermal junctions on each surface of the gap pad (i.e. one thermal junction between the gap-pad 18 and the chip 14 and one thermal junction between the gap-pad 14 and the heat sink/cooling manifold 12). Such thermal junctions would not exist if the heat sink were directly mounted to the flip-chip. Furthermore, the thermal resistance at these junctions is relatively high compared with the thermal resistance that would result if the heat sink were directly mounted to the flip-chip.

Another issue with use of the thermal gap pad 18 of the prior art assembly 10 of FIG. 1 is that there can be a significant compression/clamping force required to form the thermal gap pad 18 around the flip chips 14 so as to minimize and/or reduce air gaps. This high force can result in damage to the flip chips 14. If an implementation uses a thermal gap pad, for example (as is done in the prior art), the thermal conductive path to the cooling manifold can be poor and can greatly compromise the thermal performance of the module as well as the amount of power that could be used with it.

A further issue with the use of the thermal gap pad 18 is that the compression of the thermal gap pad 18 attempts to compensate for variations in spacing between the surface of a heat dissipating member and a heat generating device. Thus, different thicknesses at the thermal interface exist. That is, due to variations in flatness and thickness of a heat sink and circuit components, the gap-pad portion located at one circuit component (e.g. one chip) is typically compressed to a different thickness than the gap-pad portion located at another circuit component. This can be seen in FIG. 1, for example, where the thermal gap pad 18 is compressed more over the taller flip chip 14A and less over the shortest flip chips 14D. As a result of such variations in thicknesses, the junction temperature at the flip-chips 14A-14D varies from one location to another. Such variations in thickness can result in temperature gradients across the array of active circuits. When the active circuits 14 and gap pad 18 are used as part of a phased array antenna, the phased array antenna will have temperature gradients, and such temperature gradients adversely affect the performance of the phased array antenna. When a phased array antenna is used as part of a radar system (e.g. a phased array radar system), the radar system the antenna must be designed such that temperature gradients do not exceed three (3) degrees Celsius (C.). Designing an antenna of medium to high power density to meet this thermal gradient is a difficult problem to solve in a phased array radar.

Another way of cooling flip chips involves applying a thermally conductive epoxy to the flip chip and attaching a heat spreader (typically a layer of aluminum or copper) to the thermally conductive epoxy, where the heat spreader is then coupled to a cooling manifold or a liquid cooled cold plate. However for packages that contain multiple flip chips of different thicknesses, and/or which can include radio frequency (RF) RF MMICs that require consistent temperatures be achieved from device to device, the mechanical tolerances of these devices (the RF MMICs) result in thermal gaps that are problematic for a thermally conductive epoxy to meet cooling requirements. In addition, these multi-channel flip chip based devices can have an electrical interface on the opposite side of their heat sink side (i.e., the top side of the flip chip). Consequently, the thickness of each printed wiring board (PWB) to which the flip chip is attached, and the relatively large tolerances associated with the PWB can present an additional thermal management problem, and can result in a total tolerance stackup of about +/−0.013" (inches), which would require an unacceptably thick epoxy based thermal interface.

Still another proposed way to provide cooling for flip chips is through a highly thermally conductive phase change compound such as solder, wherein a thermal spreader/coldplate is directly soldered to the back (i.e., top surface) of the flip-chip, then the two are clamped together to achieve a good thermal joint. However this method has limitations should the 'backside' one or more flip chips be at electrical potential. In this instance application of this method would result in an electrical short circuit.

SUMMARY OF THE INVENTION

It is advantageous, therefore, if techniques for thermal management can minimize the thermal gap, so as to enhance thermal conductivity, using a straightforward manufacturing process that produces high thermal performance, thus providing performance improvements (improved reliability, increase radiated power) over the prior art. The prior art configuration of FIG. 1, for example, results in thermal conductivity on the order of 1-2 Watts/meter/degree-Kelvin (W/m/° K). In contrast, the techniques described in accordance with the inventive embodiments herein can provide thermal conductivities on the order of 20-40 W/m/° K and greater.

As described herein, the invention provides several techniques and apparatus for minimizing thermal gap in flip chip MMIC packaging assemblies.

In one aspect, the invention provides a method of forming a heat-dissipating structure for semiconductor circuits. First and second semiconductor integrated circuit (IC) chips are provided, where the first and second semiconductor chips each have first and second opposing sides, wherein the first and second semiconductor IC chips are configured to be fixedly attached to a top surface of a substantially planar circuit board along their respective first sides. The respective second opposing sides of each of the first and second semiconductor IC chips are coupled to first and second respective portions of a sacrificial thermal spreader material, the sacrificial thermal spreader material comprising a material that is thermally conductive. The first and second portions of the sacrificial thermal spreader material are planarized to substantially equalize a respective first height of the first semiconductor chip and a respective second height of the second semiconductor chip.

In a further embodiment, the method includes fixedly attaching the first and second semiconductor IC chips to a top surface of a substantially planar circuit board along their respective first sides. In a still further embodiment, the first and second semiconductor IC chips are coupled to the circuit board prior to planarizing. In another embodiment, each respective first and second height is measured from the top surface of the circuit board, across each respective first and second semiconductor chip, to the top of the respective planarized first portion and planarized second portion of sacrificial thermal spreader material, wherein the first height is substantially coplanar with the second height.

In a still further embodiment, the method includes thermally coupling a substantially planar, thermally conductive first thermal dissipation member to the tops of the planarized first portion of sacrificial thermal spreader material and the planarized second portion of sacrificial thermal spreader material. In yet a further embodiment, the first and second heights, prior to application of the sacrificial thermal material, are different. In still another embodiment, the sacrificial thermal spreader material comprises at least one of wafer-grade silicon, silicon carbide, aluminum nitride, gallium nitride, and gallium arsenide.

In another aspect, the invention includes an assembly of semiconductor integrated circuit (IC) chips, the assembly comprising a substrate, first and second semiconductor integrated circuit (IC) chips, and first and second portions of thermal spreader material. The substrate has a top surface. The first semiconductor IC chip has corresponding first and second opposing surfaces, wherein at least a portion of the first surface of the first semiconductor IC chip is coupled to the top surface of the substrate and wherein the first semiconductor chip has a first height. The second semiconductor IC chip has corresponding first and second opposing surfaces, where at least a portion of the first surface of the second semiconductor IC chip is coupled to the top surface of the substrate and wherein the second semiconductor chip has a second height different than the first height. The first portion of the first thermal spreader material is coupled to the second surface of the first semiconductor IC chip, the first portion having a first thickness, wherein the combination of the first height and the first thickness results in a first total height. The second portion of the second thermal spreader material is coupled to the second surface of the second semiconductor IC chip, the second portion having a second thickness, wherein the combination of the second height and the second thickness results in a second total height, wherein the second total height is substantially the same as the first total height, such that the first total height and second total height are substantially coplanar.

In a further embodiment, the first total height and second total height are substantially coplanar within +/−0.5 mil to +/−1 mil. In a still further embodiment, the first and second thermal spreader materials each comprises a material having a thermal conductivity high enough to achieve a cooling of at least 10 Watts/meter/degree Kelvin (W/m/° K) predetermined cooling from the first and second semiconductor chips and having the ability to be planarized to the first and second thicknesses, wherein the first and second thickness each are the minimum thickness required to achieve substantial coplanarity between the first and second semiconductor IC chips. In a further embodiment, the first and second thermal spreader materials each comprises at least one of wafer grade silicon, silicon carbide, aluminum nitride, gallium nitride, gallium arsenide, and a metal.

In a still further embodiment, the first and second thickness of the first and second thermal spreader materials are each constructed and arranged to minimize the thermal gap between the respective thermal spreader material, corresponding semiconductor IC chip, and substrate, to less than 2 mils. In another embodiment, the second surface of the first semiconductor IC chip has a first shape in the x and y plane and wherein the x and y dimensions of the corresponding first portion of first thermal spreader material are selected to either (a) substantially mate to the first shape or (b) have a shape selected to provide a predetermined thermal compensating effect to the first semiconductor IC chip.

In yet a further embodiment, at least one of the first and second thermal spreader materials comprises an electrically conductive material. In a further embodiment, the first and second thermal spreader materials comprise substantially the same material. In another embodiment, the first and second thermal spreader materials comprises substantially different materials.

In another aspect, the invention provides a system for cooling a plurality of semiconductor integrated circuit (IC) sub-assemblies, the system comprising at least one assembly comprising a thermal dissipation member and a plurality of sub-assemblies. The thermal dissipation member has an upper surface and a substantially planar lower surface; and the plurality of sub-assemblies are coupled to the lower surface of the thermal dissipation member. At least two of the plurality of sub-assemblies have an upper surface that is coplanar with each other, where each respective sub-assembly of the at least two sub-assemblies comprises a sub-assembly substrate, first and second semiconductor integrated circuit (IC) chips, and first and second portions of respective first and second thermal spreader materials.

The sub-assembly substrate has a top surface. The first semiconductor IC chip has corresponding first and second opposing surfaces, wherein at least a portion of the first surface of the first semiconductor IC chip is coupled to the top surface of the sub-assembly substrate and wherein the first semiconductor chip has a first height. The second semiconductor IC chip has corresponding first and second opposing surfaces, where at least a portion of the first surface of the second semiconductor IC chip is coupled to the top surface of the sub-assembly substrate and wherein the second semiconductor chip has a second height, wherein the second height is different than the first height. The first portion of the first thermal spreader material is coupled to the second surface of the first semiconductor IC chip, the first portion having a first thickness, wherein the combination of the first height and the first thickness results in a first total height. The second portion of the second thermal spreader material is coupled to the second surface of the second semiconductor IC chip, the second portion having a second thickness, wherein the combination of the second height and the second thickness results in a second total height, wherein the second total height is substantially the same as the first total height, such that the first total height and second total height are substantially coplanar.

In a further embodiment, each sub-assembly comprises a daughter card assembly having an upper surface that is substantially coplanar to the upper surfaces of the other respective daughter card assemblies and a corresponding lower surface operably coupled to a motherboard, such that at least a plurality of the daughter card assemblies are all coupled to the motherboard. In a further embodiment, the system comprises a plurality of assemblies, each assembly having first and second opposing surfaces, wherein at least a portion of the plurality of assemblies are all operably coupled to a thermal dissipation member along their respective first surfaces.

Details relating to this and other embodiments of the invention are described more fully herein.

BRIEF DESCRIPTION OF THE DRAWINGS

The advantages and aspects of the present invention will be more fully understood in conjunction with the following detailed description and accompanying drawings, wherein:

FIG. 2A is a cross-sectional illustration of a first manufacturing step in accordance with an embodiment of the invention;

FIG. 2B is a cross-sectional illustration of a second manufacturing step in accordance with the embodiment of FIG. 2A;

FIG. 6 is a first exemplary view of a device topology, in accordance with one embodiment of the invention, showing the arrangement of flip chip components on a board prior to attachment of the sacrificial thermal spreader material; and FIG. 7 is a second exemplary view of the device topology of FIG. 7, in accordance with one embodiment of the invention, showing the arrangement of flip chip components on the board after attachment and planarization of the sacrificial thermal spreader material.

In the drawings, like reference numbers indicate like elements. The drawings are not to scale, emphasis instead being on illustrating the principles of the invention.

DETAILED DESCRIPTION

Figure 1:
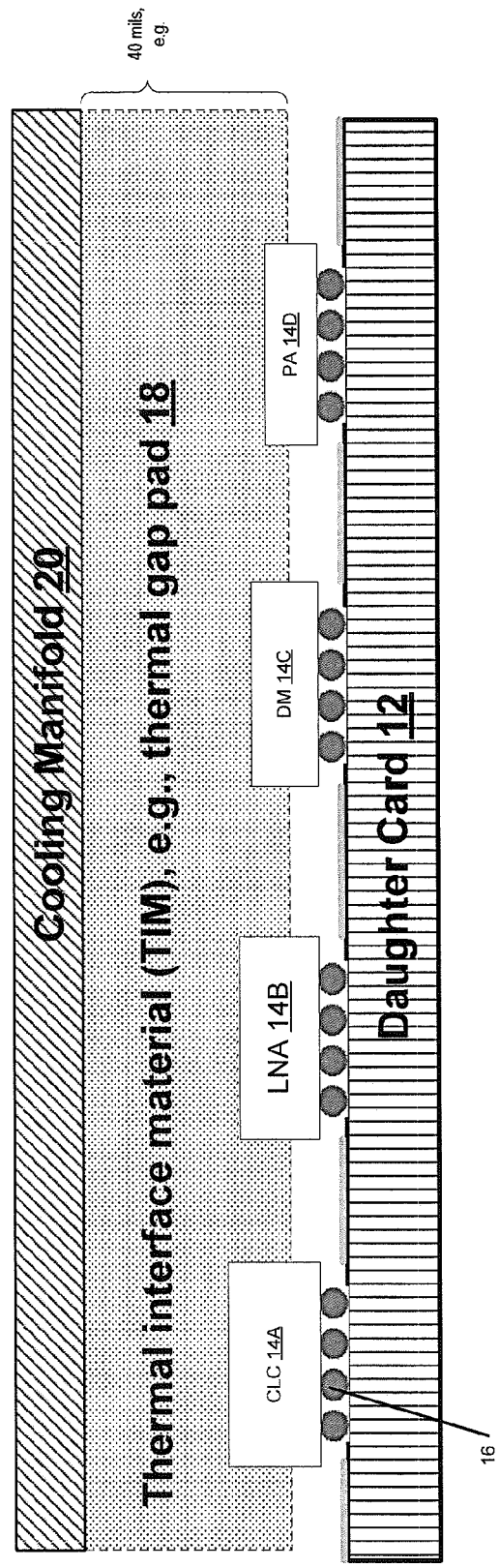
FIG. 1 is a cross-sectional illustration of a prior art configuration showing cooling of a flip-chip using a thermal gap pad.

In addition to the various embodiment or embodiments disclosed below, this invention is capable of other embodiments and of being practiced or being carried out in various ways. For example, the invention is applicable to virtually any electrical device that has components that generate heat, have multiple planar surfaces that conduct this heat to one substantially planar heat sink and therefore is and is not limited to flip chip, MMICs, or active electronically scanned array (AESA) (also known as phased array) assemblies. At least some of the embodiments of the invention described herein have applicability to devices such as mobile computing devices, having one or more CPU chips, where use of liquid and/or fan cooling is impractical or impossible. Various embodiments of the invention include (but are not limited too), integrated microelectronics modules that feature multiple flip chips that engage one substantially planar heat sink, and the like.

Advantageously, the embodiments of the invention described herein can be used to help improve heat dissipation for virtually any electrical device having multiple heat-generating components that have substantially planar surfaces, and furthermore, by improving heat dissipation, the embodiments of the invention described herein can help to lower the operating temperature of virtually any heat dissipating component, effectively prolonging the life of that component. For example, during testing of the embodiments described herein, the inventors have found that the improved thermal performance resulting from use of the inventive sacrificial thermal spreader apparatuses and methods described herein result in operating temperatures of the devices that is reduced by up to ten degrees Celsius (C), which can have a significant improvement in adding operational life to such devices. Thus, it is to be understood that the invention is not limited in its application to the details of construction and the arrangements of components set forth in the following description or illustrated in the drawings.

At least some embodiments of the thermal interface described herein are described as being done on at least one portion (e.g., a single "cell" that may be one of many cells) on a given circuit board, and, advantageously, all portions of a given circuit board, i.e., all heat dissipating devices, so as to eliminate all tolerance stackup by applying it to each heat dissipating device of a higher level electronic assembly, such as a circuit board that is part of an "active panel array" antenna, but this should not be viewed as limiting. It should be appreciated that the thermal interface and concepts described herein may also be used with other heat generating devices and is not limited to use with active panel array antennas. Rather, the thermal interface and concepts can be used with any multi-chip circuit which utilizes any type of a heat dissipating member (e.g., heat sink, cooling manifold, and the like). In particular, the thermal interface structures, methods, and concepts described herein can be used in any application in which mechanical or other tolerances of a heat generating structure and a heat sink promote use of an interface structure having low thermal resistance therebetween.

A "panel array antenna" (or "panel array" or more simply "panel") to be described herein refers to a multilayer printed wiring board (PWB) which includes an array of antenna elements (or more simply "radiating elements" or "radiators"), as well as RF, logic and DC distribution circuits in one highly integrated PWB. A panel is also sometimes referred to herein as a tile array (or more simply, a "tile"). A panel array antenna may be provided from a single panel or from a plurality of panels. In the case where an array antenna is provided from a plurality of panels, a single one of the plurality of panels is sometimes referred to herein as a "panel sub-array" (or a "tile sub-array").

A heat sink interface to the assemblies described herein (e.g., a second thermal dissipating member 20 (e.g., a cooling manifold 20) described further herein) may be disposed over a single panel, multiple panels or over portions of one or more. Thus, the heat sink interface may be provided having a size and shape selected in accordance with the needs of the particular application in which it is being used.

Thus, although the description provided herein describes a thermal interface and related concepts in the context of a subassembly that is part of an array antenna having a substantially square or rectangular shape, those of ordinary skill in the art will appreciate that the concepts equally apply to other sizes and shapes of antennas or other circuits having a variety of different sizes and shapes. In particular, the embodiments of the invention described herein have applicability to other types of chips and circuits besides the flip chip circuits described herein. It is envisioned that the embodiments of the invention described herein have applicability to any circuit or configuration where improved thermal dissipation is desirable.

Applications of at least some embodiments of the thermal interface described herein include, but are not limited to, radar, electronic warfare (EW) and communication systems for a wide variety of applications including ship based, airborne, missile and satellite applications. It should thus be appreciated that the thermal interface described herein can be used as part of a radar system or a communications system. As will also be explained further herein, at least some embodiments of the invention are applicable, but not limited to, commercial, military, airborne, shipborne, communications, unmanned aerial vehicles (UAV) and/or commercial wireless applications.

The sub-assembly to be described herein can be part of a panel that also utilizes elements that include, but are not limited to, embedded circulators; a slot-coupled, polarized egg-crate radiator; a single integrated monolithic microwave integrated circuit (MMIC); and a passive radio frequency (RF) circuit architecture. For example, as described further herein, technology described in the following commonly assigned United States patents and patent publications can be used in whole or in part and/or adapted to be used with at least some embodiments of the panel (aka tile subarrays) described herein: U.S. Pat. No. 6,611,180, entitled "Embedded Planar Circulator"; U.S. Pat. No. 6,624,787, entitled "Slot Coupled, Polarized, Egg-Crate Radiator"; U.S. Pat. No. 6,731,189, entitled "Multilayer stripline radio frequency circuits and interconnection methods;" U.S. Pat. No. 7,859,835, entitled "Method and Apparatus for Thermal Management of a Radio Frequency System"; U.S. Pat. No. 7,742,307, entitled, "High Performance Power Device"; U.S. application Ser. No. 12/566,818, entitled "Heat Sink Interface Having Three-Dimensional Tolerance Compensation," filed Sep. 25, 2009; U.S. application Ser. No. 12/580,356, entitled "Cooling Active Circuits," filed Oct. 16, 2009; and U.S. application Ser. No. 12/880,350, entitled "An Assembly to Provide Thermal Cooling," filed Sep. 13, 2010. Each of the above patents and patent applications is hereby incorporated herein by reference in their entireties.

Advantageously, at least some the embodiments of the invention described herein are intended to help minimize the thermal resistance between the heat dissipating device and the heat sink in assemblies using flip chips having differing heights or in assemblies where the heights of given flip chips mounted to a board (e.g., where the respective heights of the flip chips are measured from the base of the circuit board to which the flip chip is mounted, to the opposing side of the flip chip). Keeping the thermal gap very low greatly improves the thermal resistance (the larger the thermal gap, the greater the thermal loss). In contrast to the prior art thermal conductivity of 1-3 Watts/meter/degree-Kelvin, with the embodiments of the invention described herein, the inventors have found that these embodiments provide cooling of at least 20-40 W/M/K, and potentially even higher than 40 W/M/K, as well.

As will be described further below, the embodiments of the invention include a techniques and apparatuses for minimizing/bridging the thermal gaps in a cooling assembly for a flip chip, which embodiments can provide significantly improved thermal performance as compared to known approaches. For example, as compared with the prior art thermal gap pad approach of FIG. 1, the tolerance stackup of the devices has insignificant effect on thermal resistance of thermal gap pads because the thermal gap pads by their nature must be relatively thick when compared to the tolerance stackup pad thickness=0.020" vs. tolerance stackup of 0.0013". In the exemplary embodiments of FIGS. 2A-2F and 7, a sacrificial thermal spreader material, made from a material having a good thermal conductivity, is bonded to all of the flip chips, and this sacrificial thermal spreader material is then planarized/lapped away so as to create a substantially flat planar surface across all backs (top sides) of all the flip chips, where the substantially flat surface thus is at substantially the same height from the bottom side of the circuit board, across all of the flip chips. Because this method produces a very planar and flat surface and a very consistent thickness of overall assembly, the range thermal gap between flip chip and thermal spreader is minimized, and the mating to a correspondingly flat thermal spreader will be very close, greatly minimizing the thermal gap and enabling cooling of at least 20-40 W/m/° K.

Figure 5:
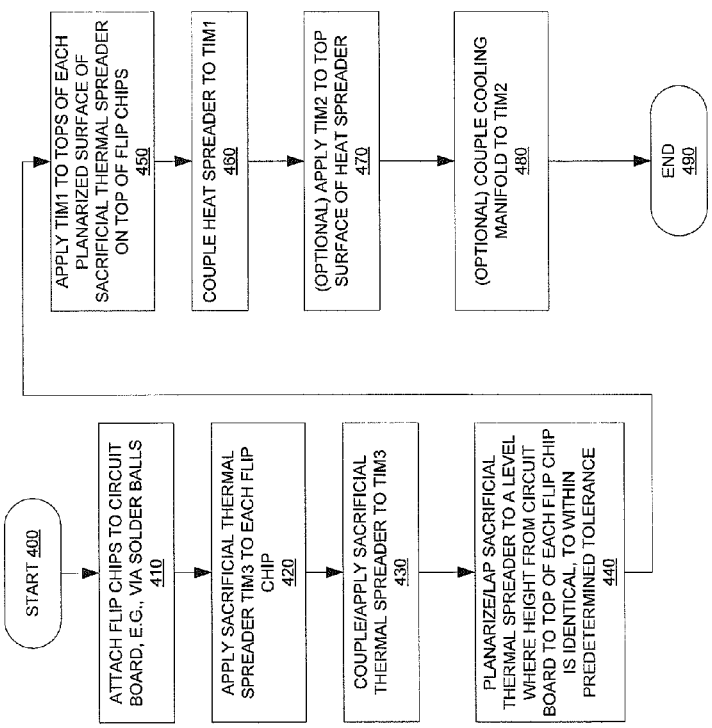
FIG. 5 is a flow chart showing steps for manufacture of the embodiment of FIG. 2F.

FIGS. 2A-2F are cross-sectional views of a sequence of manufacturing steps for making a thermal management panel using the sacrificial thermal spreader material, in accordance with one aspect of the invention, and FIG. 5 is a flow chart detailing the steps for manufacture of this second aspect of the invention.

Reference is now made first to FIG. 2A, which is a cross-sectional illustration of a first manufacturing step 100A (corresponding to step 410 of FIG. 5), in accordance with one embodiment of the invention. A plurality of flip chip devices 14A-14D are coupled to a printed wiring board/card 12 (which is shown for illustrative purpose only as a daughter card), via a plurality of solder balls 16.

The circuit board/daughter card 12 is a substantially planar printed circuit card or printed wiring board (PWB) to which the plurality of flip chip devices 14A-14D are mounted. As is known in the art, such cards 12 often have multiple layers, including signal carrying layers, grounding layers, radio frequency (RF) power and logic circuits, and the like. The flip chip devices 14A-14D are mounted to corresponding pads on the first surface 12A of the card 12 using the so-called "flip chip" mounting technique. In at least some embodiment, the daughter card 12 is a multi-layer card, as is known in the art, where the layers, could, for example, include internal and external electrical interconnects, strip lines, waveguides, additional dielectric and/or conductive layers, and the like, as is well understood by those of skill in the art. In addition, depending on the application, the entire daughter card 12 can be encapsulated with a protective coating (e.g., so-called "conformal coating", such as urethane, silicone, acrylic, parylene, etc., not shown in the drawings), as is known in the art. In addition, the illustration 100A shows, merely for illustrative purposes, optional solder mask material 58 is adjacent to (and surrounding, although this is not shown in FIGS. 2A-2F) the solder balls 16.

Figure 2C:
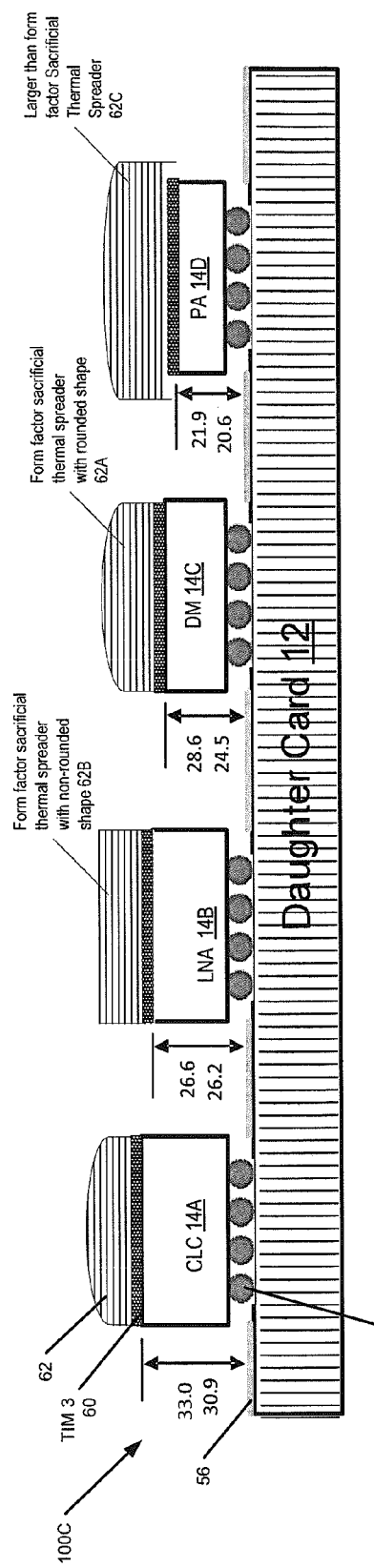
FIG. 2C is a cross-sectional illustration of a third manufacturing step in accordance with the embodiment of FIG. 2A.

The flip chip devices 14A-14D are shown for purely exemplary purposes as including a control logic circuit (CLC) 14A, a low noise amplifier (LNA) 14B, a drain modulator (DM) 14C, and a power amplifier (PA) 14D. As the illustration of FIG. 2A shows, the various flip chip devices 14A-14D have differing heights. The particular arrangement of flip chip devices 14 having differing heights shown in FIGS. 2A-2F, wherein the flip chips are arranged from largest height (e.g., 14A) to shortest (e.g., 14D) is provided for illustrative purposes only. One of skill in the art will appreciate that the flip chip devices 14 could be arranged in virtually any manner (e.g., alternating heights). Advantageously, the flip chip devices 14A-14D are arranged on the daughter card 12 such that flip chips 14 having similar heights are disposed substantially near each other, but this is not required. Note, also, that in some instances, the effective height of the flip chip after mounting, as measured from the base of the circuit board to the opposing side of the flip chip, could vary even for flip chips having the same height, if there is some other variation in the tolerance stackup, e.g., some variation in daughter card 12 and/or in the heights of solder balls 16.

In accordance with one embodiment of the invention, described further below, some techniques adapted from the manufacturing process of "wafer thinning" (often used at the wafer level for electronic components) are further adapted to a different, inventive use in the multi-chip electronic assembly requirement. As those of skill in the art are aware, for various types of devices (especially microwave devices), the thickness of the device from its ground plane to the top has an impact on the performance of the device, with thinner being better. However, the required thin sizes of devices (e.g., about 4 mils) are difficult to handle properly during much of the manufacturing processes. So, manufacturing of these devices often starts with a wafer that is significantly thicker than the desired end size (e.g., 10 mils to start, compared with 4 mils as a desired end result), and, when many of the production steps are complete but before putting in vias, metallization, and ground plane, the wafer is thinned, e.g., from 10 mils to 4 mils, using a lapping process.

In at least some of the embodiment described herein, a lappable, thermally conductive material, such as a thermally conductive, wafer-grade silicon material, is applied to the top side (back side) of each of the flip chips that are already coupled to a circuit card such as a daughter board, as a "sacrificial" thermal spreader, then a portion of this added sacrificial material is removed, through a lapping/planarizing process, so that the resulting height from daughter board to the top of the planarized surface is substantially the same. Unlike the prior art wafer thinning process, the actual flip chips themselves are not being thinned; rather, a layer of thermally conductive and lappable material is added to a chip (which chip itself may have been previously thinned), and then lapped away to a predetermined point, which may vary depending on the height of the flip chip, so as to effectively "equalizes" component height across the entire assembly, resulting in a substantially planar surface to which a planar heat spreader can be applied.

An alternate view of the "before" step of FIG. 2A, for an exemplary board with flip chips attached, is shown in FIG. 6, which is a first exemplary view 500 of a device topology, in accordance with the second embodiment of the invention, showing the arrangement of flip chip components on a board prior to attachment of the sacrificial thermal spreader material. As FIG. 6 illustrates, the flip chip components 14E, 14F, and 14G each have a different height prior to planarization.

FIG. 2B is a cross-sectional illustration of a second manufacturing step 100B (corresponding to step 420 of FIG. 5) in accordance with one embodiment of the invention. In this manufacturing step, thermal interface material 3 (TIM3) 60 is applied to the back side (top) of each respective flip chip 14A-14D. TIM3, in one embodiment, as a non-electrically conductive epoxy having high thermal conductivity and which is capable of forming a very thin bond line. In one embodiment, the thickness of TIM3 60 is about 1 mil. Of course, in embodiments where electrical isolation is not required, the TIM3 60 can be made using an epoxy that is both electrically and thermally conductive.

FIG. 2C is a cross-sectional illustration of a third manufacturing step 100C (corresponding to step 430 of FIG. 6) in accordance with the second embodiment of the invention. As FIG. 4C illustrates, sacrificial thermal spreader material 62 is coupled to each of the flip chips 14 via TIM3 60. In the embodiment of FIG. 2C, the sacrificial thermal material 62 is formed from so-called "chicklets" of wafer grade silicon material. These sacrificial chicklets 62 are picked and placed using conventional equipment much like that used to assemble the daughter cards 12. That is, the sacrificial chicklets 62 are treated just like they were another component. In one embodiment, this sacrificial thermal spreader material 62 is applied to a thickness of up to about 40 mils, which can, of course, vary depending on component height. As shown in FIG. 2C, at least a portion of the silicon chicklets 62 are advantageously sized to be approximately the same size as the component on which it is placed, but the invention is not so limited. For example, in one example, the chicklet 62C is larger than the component 14D, which helps to improve power dissipation by providing more thermal spreading. In addition, the sacrificial thermal spreader chicklet 62 can have various types of shapes, such as a rounded shape 62A or a non-rounded shape 62B, but these illustrations are not limiting.

In addition, In at least one embodiment, it may be advantageous and/or required to use a sacrificial thermal spreader chicklet 62 having a different footprint or shape (i.e., in the x and y direction) than the footprint or shape of the device or component to which it is attached. For example, in one embodiment, the sacrificial thermal spreader chicklet 62 is used is used in an application that requires all devices be at the same temperature (e.g., where having a "same" temperature is required to a level more stringent than described in some of the other illustrated embodiments herein), where there are a plurality of unit cells coupled to a coldplate. In this example, if the coldplate temperature varies by position due to the heating up of a flowing coolant, it is possible to adjust the temperature of a first unit cell at a first location/position to compensate for a temperature variation occurring at a second unit cell at a second location/position, on the same coldplate. For example, in one embodiment, this is accomplished by making one or more components of the unit cell incrementally "hotter" by varying the size of the sacrificial thermal spreader 62 that is attached to one or more of the components, such as by making the sacrificial thermal spreader portion smaller than the footprint of the device to which it is coupled, to match the temperature of that first unit cell to that of the second unit cell at the second location/position (e.g., the last unit cell.) Thus, the shape of the sacrificial thermal spreader 62 can, in at least one embodiment, be selected to provide a desired thermal compensating effect to the component to which it is couples. This temperature adjustment can, of course, be done at more than one location, for more than one component, depending on the needs of a given application.

In one embodiment, the sacrificial thermal spreader material 62 is a material having high thermal conductivity, such as wafer grade silicon (e.g., undoped silicon). In other applications, as will be appreciated by those of skill in the art, other materials having good thermal conductivity and able to be formed and lapped, planarized, or ground down (as described below) to a very small thickness, are usable, including but not limited to silicon carbide, aluminum nitride, and thermally conductive ceramic materials. Additionally, if the configuration of a given application permits it, one or more of the sacrificial thermal spreader chicklets 62 could be made of a lappable material that is both thermally and electrically conductive, such as a metal. Although the embodiment of FIG. 2C illustrates that all of the sacrificial chicklets 62 be made from the same material, it is not required in all embodiments of the invention that all chicklets be made of the same material. For example, depending on the application, in some embodiments, a portion of the sacrificial chicklets 62 are formed from material that is both electrically and thermally conductive, and the remaining portion of chicklets are formed from material that is thermally conductive but not electrically conductive. In the embodiments of FIGS. 2A-2F, however, the sacrificial thermal spreader 62 is not electrically conductive, because the back side of at least one of the electrical components 14 is "hot" (i.e., electrically active), so it is not possible to use electrically conductive material. Note also that not all of the sacrificial thermal chicklets 62 are required to be made of the same type of thermally conductive material, nor are all required to have the same shape. There can be a mix different sacrificial thermal spreader 62 materials, depending on the required thermal conductivity, whether or not electrical conductivity is required, the power density of the given component 14, and the cooling system used, as one of skill in the art would appreciate.

Figure 2D:
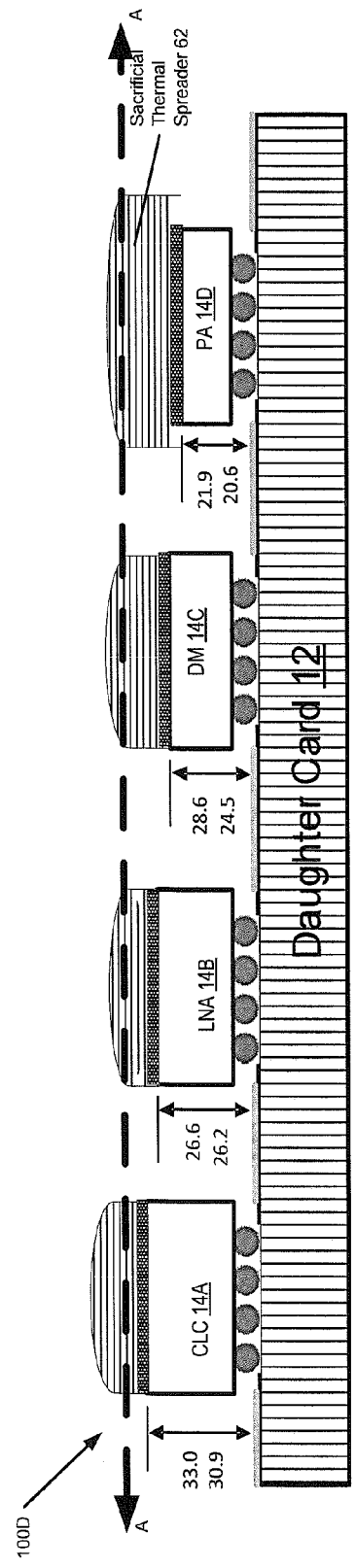
FIG. 2D is a cross-sectional illustration of a fourth manufacturing step in accordance with the embodiment of FIG. 2A.

Reference is now made to FIG. 2D, which is a cross-sectional illustration 100D of a fifth manufacturing step in accordance with one embodiment of the invention, and also to step 430 of FIG. 5. Once the sacrificial thermal spreader material 62 has been applied to the flip chip devices 14, a planarization process (also known in the art as a lapping process) is performed to form the topmost surface of the sacrificial thermal spreader material 62 into a substantially planar and flat surface having, at each flip chip device 14, a substantially uniform height from the card 12, such that the tops of all the flip chip devices 14 are substantially coplanar. The equipment used for this planarization process is not unlike that used for the aforementioned wafer thinning processes done at the wafer level during manufacture of the actual flip chip wafer (i.e., during the manufacture of flip chips, before they are made into an integrated circuit), as is known in the art. Typically the lapping process can take ten minutes or less. This process differs from the prior art, however, because in prior art processes, the wafer itself already is "thick" and is thinned via the given process—no material is physically coupled to the already finished wafer to facilitate wafer thinning.

In contrast, with the technique described herein and illustrated in accordance with the embodiment of FIGS. 2A-2F and 5, the starting point is an already-manufactured flip chip integrated circuit 14, to which wafer-grade material is coupled (via TIM3 60), so as to create, effectively, a "thick" portion of wafer-like, wafer-grade material that is amenable to be thinned to a predetermined height on each chip via one or more known wafer thinning processes, where this thinned portion has a high thermal conductivity (in fact, a thermal conductivity on a par with, or the same as, the flip chip 14 itself).

Various different techniques are usable in accordance with the invention for wafer thinning, such as grinding, chemical etching, a combination of chemical and mechanical etching (e.g., so-called chemical mechanical planarization (CMP), and the like, as is known in the art. Such lapping processes are often highly controllable. Exemplary methods known in the art for wafer thinning are described, e.g., in U.S. Pat. Nos. 5,127,984, 6,764,573, 6,930,023, and 7,371,664, each of which is hereby incorporated by reference. Advantageously, the method used to planarize in at least one embodiment of the invention is highly controllable and able to achieve a coplanarity from flip chip 14 to flip chip 14 within +/−0.0005 inches. In one embodiment, a precision lapping process has been shown to achieve this tightly controlled tolerance. As those of skill in the art will appreciate, the lapping process can be done with various grits depending on the substrate material and how rapidly it is desired that the planarization process occur. In addition, other steps that are part of the lapping process, such as cleaning, etc., are well known to those of skill in the art and are not illustrated here.

Figure 2E:
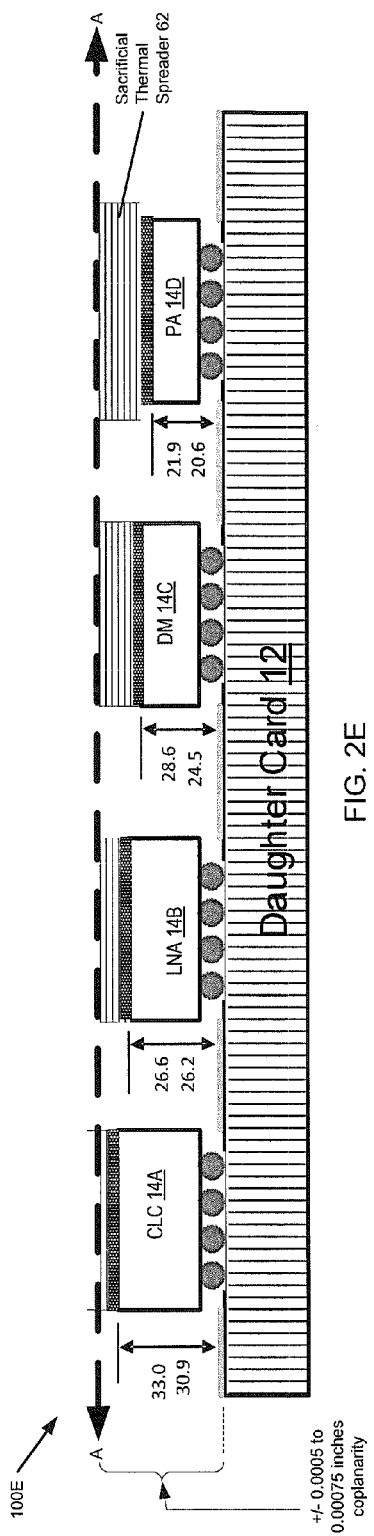
FIG. 2E is a cross-sectional illustration of a fifth manufacturing step in accordance with the embodiment of FIG. 2A.

FIG. 2E is a cross-sectional illustration 100E of an embodiment of the invention after planarization of the sacrificial thermal spreader 62, has been completed, showing that the heights of each flip chip 14 now all fall along the A-A line, to within +/−0.0005 inches (+/−0.5 mils). Reference also is now made briefly to FIG. 7, which is a second exemplary view 600 of the device topology of FIG. 6, in accordance with the second embodiment of the invention, showing the arrangement of flip chip components on the board after attachment and planarization of the sacrificial thermal spreader material. As this image shows, the flip chip devices 14 now all have substantially coplanarity with each other to within about +/−0.0005 inches (0.5 mils). The inventors of the instant invention have achieved this substantial coplanarity, within these tolerances, across both entire substrates/cards and entire panels (e.g., arrays of "cells" on one or more substrates/cards), for at least some embodiments of the invention. For other embodiments of the invention, the substantial coplanarity between devices can range from 0.5 mils to 2 mils.

As those of skill in the art will appreciate, this substantial coplanarity helps to ensure that heat dissipating devices (e.g., the flat heat spreader described further below) make uniform thermal contact with the entire top surface (i.e., bottom) of each flip chip device 14, with minimal thermal gap (ideally less than 1 mil), helping to ensure more uniform heat dissipation.

Figure 2F:
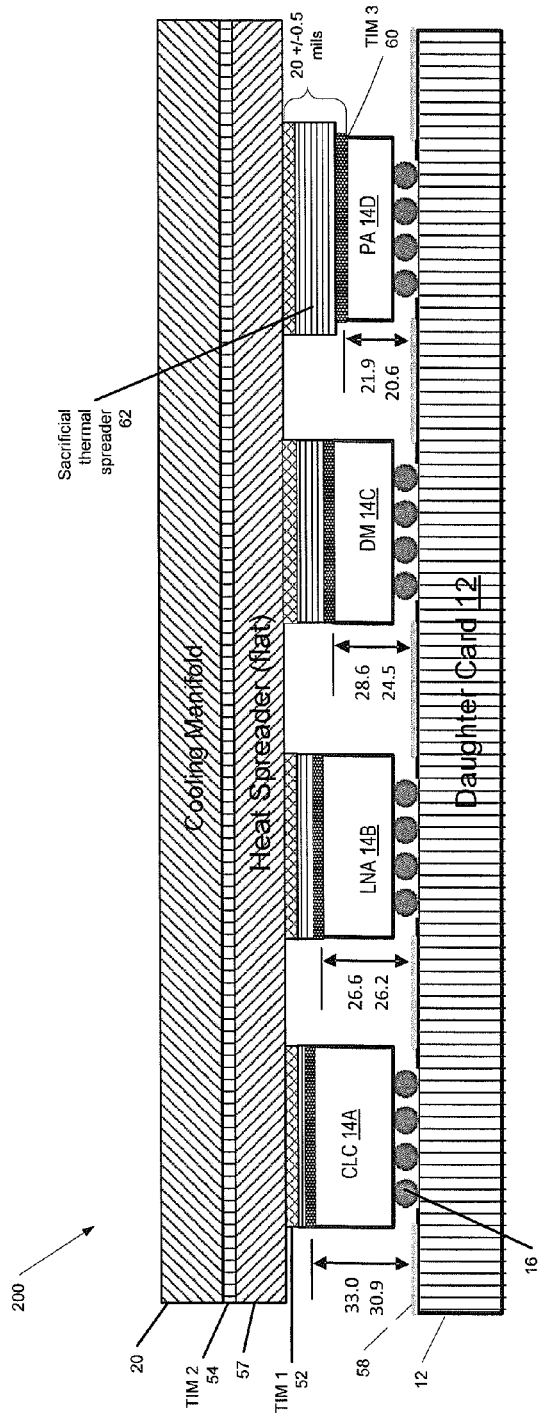
FIG. 2F is a cross-sectional illustration of a the embodiment of FIG. 2A after all manufacturing steps have been completed.
Figure 3:
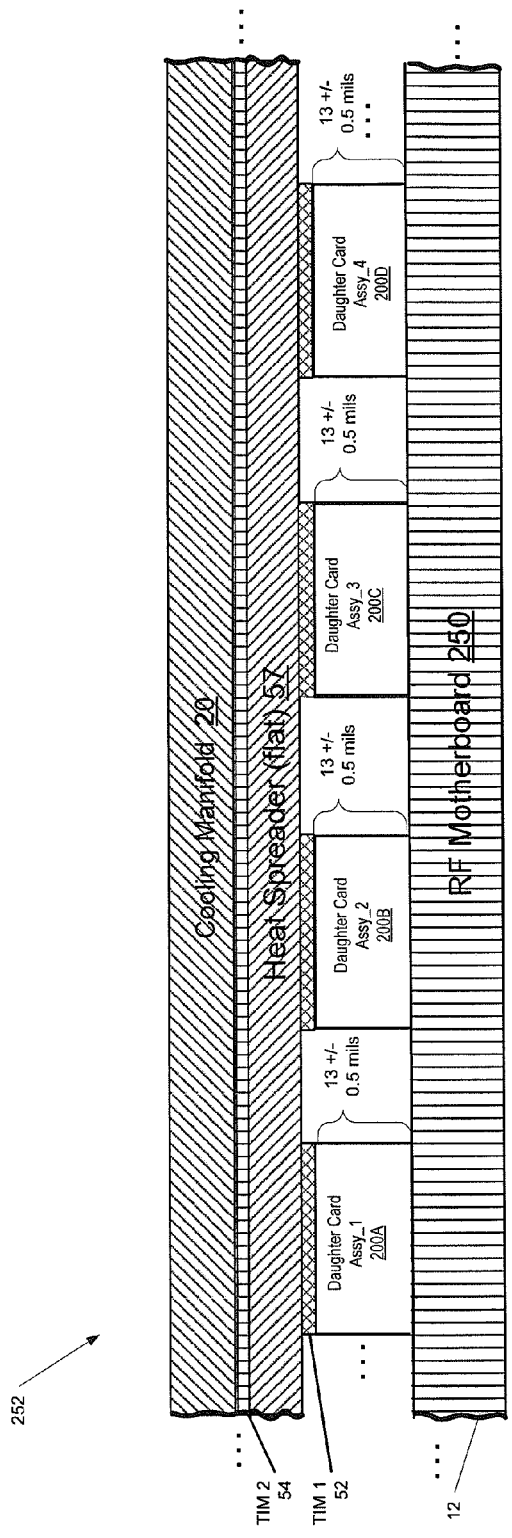
FIG. 3 is a cross-sectional illustration of a motherboard assembly having a plurality of the daughter card assemblies of FIG. 2F coupled to an RF motherboard, in accordance with one embodiment of the invention.

In addition, e bottom of the daughter board 12 is used for thickness registration, because, in at least one embodiment, these daughter boards 12s are then attached to another microwave board (e.g., an RF mother board 250) where electrical signals are transmitted back and forth. This is illustrated, for example, in FIG. 3, which is a cross-sectional illustration of a motherboard assembly 252 having a plurality of the daughter card assemblies 200 of FIG. 2F coupled to an RF motherboard 250, in accordance with one embodiment of the invention. As FIG. 3 illustrates, a plurality of daughter card assemblies 200 (i.e., the entire assembly of FIG. 2F) can be coupled to an RF motherboard 250, as well as to a further heat spreader 57 and cooling manifold 20. Since multiple daughter card assemblies 200 are mated to a single RF mother board 250 (the illustration of FIG. 3 shows only 4, but this is not limiting), the thickness tolerance of each daughter card assembly's 200 printed wiring board becomes critical to the size of the gap which would exist between the back side of the thermal spreader 57 and the cooling manifold 20. Therefore, by registering the bottom side of the printed wiring board (pwb), it is possible to manufacture all daughter cards to a thickness of +/−0.0005" (+/−0.5 mils), whereas the tolerance stackup of the prior art method (e.g., of FIG. 1) has a tolerance stackup of 0.013" (13 mils). In addition, because the RF motherboard 250 of FIG. 3 effectively acts like a reference plane to which all of the daughter card assemblies 200 get attached, ensuring that the thickness of each daughter card be substantially identical (within a predetermined acceptable tolerance) is important to desired thermal performance. If the one of the daughter card assemblies 200 had a thickness that was sufficiently different from the others, it might prevent that daughter card assembly 200 (or even others of the daughter card assemblies 200) from making appropriate thermal contact to the cooling manifold 20.

Figure 4:
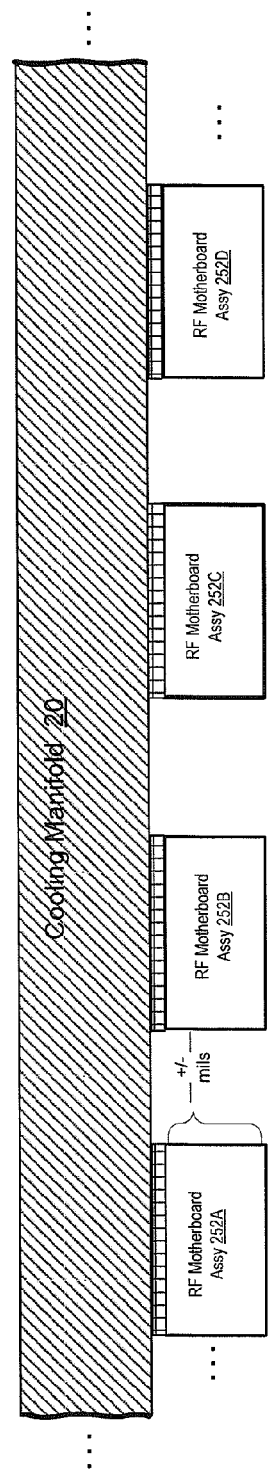
FIG. 4 is a cross sectional illustration of an system-level assembly having a plurality of the motherboard assemblies of FIG. 3 coupled to a cooling manifold, in accordance with one embodiment of the invention.

Similarly, a plurality of the motherboard assemblies 252 of FIG. 3 can be assembled to a higher level assembly 260, as shown in FIG. 4, which is a cross sectional illustration of an system-level assembly having a plurality of the motherboard assemblies 252 of FIG. 3 coupled to a cooling manifold 20, in accordance with one embodiment of the invention.

Referring again to FIGS. 2F and 5, reference is now made to steps 450-480 of FIG. 56 and to FIG. 2F, which is a cross-sectional illustration 200 of one embodiment of the invention after all manufacturing steps have been completed. After planarization is complete, a thin layer of TIM1 material 52 (e.g., a layer of about 0.005 to 0.0015 inches thick) is applied to the planarized surface of sacrificial thermal spreader material 62 (step 450 of FIG. 6). Various techniques can be used to apply the TIM1 52, such as stencil techniques, direct deposition, etc., as is known in the art.

The TIM1 material is a material having high thermal conductivity and which is capable of coupling the heat spreader 57 to the planarized surface of the flip chips 14. Usable materials for TIM1, in accordance with one embodiment of the invention, include materials having low thermal resistance and high thermal conductivity, e.g. thermal grease, thermally conductive epoxy, phases change compounds, aluminum nitride filled epoxy (AlN), thermally conductive epoxy, and the like, available from manufacturers such as Epoxy Technology, Inc. of Billerica, Mass.; Creative Materials of Tyngsboro, Mass.; Henkel of Dusseldorf, Germany, and many others, as those of skill in the art are aware. Advantageously, in at least some embodiments the thermally conductive epoxy also is non-electrically conductive, if required by the given application, but those of skill in the art will, of course, recognize that for some applications an epoxy that is both thermally and electrically conductive is advantageous.

It will also be appreciated that for applications where electrical conductivity is required and/or not an issue, solder and other electrically conductive materials that also have low thermal resistance are usable for TIM1. Note also that the thickness of the TIM1 52 that is applied to the rear sides (i.e., top sides) of the flip chips 14 can vary. Generally, the thickness of TIM1 52 will be the minimum thickness required to enable the corresponding step of the stepped heat spreader 56 to make sufficient thermal contact with the corresponding flip chip 14 (or array/row of flip chips 14, if the flip chips 14 are arranged by height). For example, in one embodiment, the thickness of TIM1 52 ranges from 1 to 3.6 mils.

Referring again to FIG. 2F, a first thermal dissipation member (e.g., for this embodiment, the substantially planar and flat heat spreader 57) is coupled to the TIM1 52 (step 460), so as to enable the flat heat spreader 57 to make good thermal contact with the corresponding flat, planarized surface of the sacrificial thermal spreader material 62 (and thus make good thermal contact to the flip chips 14). The flat heat spreader 57 of this embodiment is substantially flat and is made from high thermal conductivity materials (or combinations of materials) as is known in the art. As can be seen in FIG. 2F, a thermal path of high thermal conductivity now runs from the flip chips 14, through the very thin layer of high thermal conductivity TIM3, through the sacrificial thermal spreader material 62 (which itself advantageously is made from material similar to that of the flip chips 14 themselves and this has similar high thermal conductivity), through TIM1, and to the flat heat spreader 57.

Referring to FIG. 2F and to steps 470-480 of FIG. 5, optionally, in at least some embodiments, a layer of TIM2 54 can be applied to the top surface of the flat heat spreader 42 and a second thermal dissipation member 20 (shown for illustrative purposes in FIG. 2F as being a cooling manifold, but this is not limiting) can be coupled to the TIM2 54, to provide additional cooling. Addition of the second thermal dissipation member 20 is not required for the invention, but is advantageous because it provides additional cooling.

The first thermal dissipation member 57 (i.e., heat spreader 57) is made from a thermally conductive material able to be formed (e.g., via machining, molding, etc.) into a substantially planar and flat board. Examples of usable materials include, but are not limited to, metals and ceramics. For example, in at least some embodiments, the material of the heat spreader 57 has a higher thermal conductivity than that of the flip chips 14. Generally, it is advantageous if the material for the heat spreader 57 has low resilience, to ensure that the heat spreader 57 maintains its substantially planar and flat shape so as to maintain good and intimate thermal contact with the TIM1 and the TIM1 52 materials. Although the heat spreader 57 as is illustrated in FIG. 2F as being made from a single, solid piece of material, the invention is not so limited. As those of skill in the art will appreciate, the heat spreader 57 could be formed using more than one thermally conductive material coupled together in any combination The TIM2 material coupling the heat spreader 57 to the cooling manifold 20 is, for at least one embodiment, a wax-based phase change material (PCM). The TIM2 material is a thermal interface material that is being used to eliminate the miniscule air space between the cooling manifold 20 and the heat spreader 57. However, those of skill in the art will appreciate that other materials are usable.

The second thermal dissipation member 20 of FIG. 2F (and FIGS. 3 and 4, as well) is shown for illustrative purposes as being a cooling manifold 20, but, as those of skill in the art will appreciate, the second thermal dissipation member 20 can be any type of thermal dissipation member capable of dissipating heat, e.g., a heat sink, cold plate, evaporator, and the like. The second thermal dissipation member 20 can, for example, be made using one or more materials having high thermal conductivity (e.g., metals such as copper and aluminum). The cooling manifold 20 of FIG. 2F is able to conduct heat away from the heat spreader 57 (and the flip chips 14) into the environment via contact between the cooling manifold 20 and the air and via liquid flowing through the cooling manifold (via conduction and convection), or via further contact between the cooling manifold 20 and another structure (not shown) designed to transfer the heat to the surrounding air or still another liquid via conduction and convection. In addition, as noted previously, the second thermal dissipation member 20 could be a part of a larger thermal dissipation member constructed and arranged to cool a plurality of other "cells" at once, where the other cells in the plurality could include the same elements as shown in FIG. 2F or entirely different elements. This is illustrated further in FIGS. 3 and 4.

In at least some embodiments of the invention, the thermal performance requirements are such that the thermal dissipation member 20 is not required, because the arrangement of flip chips 14, TIM1 52 and first thermal dissipation member (heat spreader 57) is sufficient to provide the desired thermal cooling. In further embodiments, however, use of the second thermal dissipation member (e.g., cooling manifold 20) is advantageous because it helps improve thermal performance by providing further heat dissipation.

As those of skill in the art will appreciate, in at least some embodiments, various manufacturing tolerances can be taken into account in the arrangement of components in FIGS. 2A-2F, 3, and 4, in particular in the layout of the various heights of flip chip devices 14 and in the relative thicknesses of the first and second thermal dissipation members.

It should be noted that certain aspects and/or the order of the manufacture process detailed in FIG. 5 can vary without departing from the invention, as those of skill in the art will appreciate. For example, in the embodiments of FIGS. 2F, 3, and 4, the thermal dissipation member 20 can be coupled together to the given heat spreader 57 prior to the given heat spreader being coupled to the rest of the assembly (i.e., the flip chips and board). However, those of skill in the art will recognize that this variation in process will be more or less difficult depending on the weight of the thermal dissipation member 20. In addition, as noted previously in connection with FIGS. 3 and 4, the thermal dissipation member 20 could be a larger member constructed so as to cool a multiple of cells on a given board (e.g., where each cell can be an arrangement similar to that shown in FIG. 2F or 3 at once. A similar "geometric progression" of coupling each assembly to a higher level assembly, having its own respective thermal dissipation member, can be realized, as will be appreciated by those of skill in the art.

In at least some embodiments, a multiple of cells cooled by the same thermal dissipation member could include other types of cells other than shown in this application. In at least some embodiment, the multiple of cells could include at least combinations of the embodiments described herein In addition, in at least some embodiments, for an array of cells, the planarization process described in connection with FIGS. 4-8 could be done on multiple cells at once.

In describing the embodiments of the invention illustrated in the figures, specific terminology (e.g., language, phrases, product brands names, etc.) is used for the sake of clarity. These names are provided by way of example only and are not limiting. The invention is not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, modules, tables, software modules, objects, data structures, servers, etc. Such terminology used herein, however, is for the purpose of description and not limitation.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

In the Figures of this application, in some instances, a plurality of system elements or method steps may be shown as illustrative of a particular system element, and a single system element or method step may be shown as illustrative of a plurality of a particular systems elements or method steps. It should be understood that showing a plurality of a particular element or step is not intended to imply that a system or method implemented in accordance with the invention must comprise more than one of that element or step, nor is it intended by illustrating a single element or step that the invention is limited to embodiments having only a single one of that respective elements or steps. In addition, the total number of elements or steps shown for a particular system element or method is not intended to be limiting; those skilled in the art can recognize that the number of a particular system element or method steps can, in some instances, be selected to accommodate the particular user needs.

Having described and illustrated the principles of the technology with reference to specific implementations, it will be recognized that the technology can be implemented in many other, different, forms, and in many different environments. The technology disclosed herein can be used in combination with other technologies.

In addition, those of ordinary skill in the art will appreciate that the embodiments of the invention described herein can be modified to accommodate and/or comply with changes and improvements in the applicable technology and standards referred to herein. Variations, modifications, and other implementations of what is described herein can occur to those of ordinary skill in the art without departing from the spirit and the scope of the invention as claimed.

The particular combinations of elements and features in the above-detailed embodiments are exemplary only; the interchanging and substitution of these teachings with other teachings in this and the referenced patents/applications are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto.

Having described the preferred embodiments of the invention, it will now become apparent to one of ordinary skill in the art that other embodiments incorporating their concepts may be used. These embodiments should not be limited to the disclosed embodiments, but rather should be limited only by the spirit and scope of the appended claims.

The invention claimed is:

1. A method of forming a semiconductor circuit, the method comprising;

providing first and second semiconductor devices, each respective first and second device having a respective first and second opposing surfaces, wherein the first and second semiconductor devices are configured to be fixedly attached to a top surface of a circuit board along their respective first surfaces, such that the respective second surfaces of the first and second semiconductor devices are each oriented to be disposed above the top surface of the circuit board;

coupling a plurality of electrical connections disposed on the first surface of at least one of the first and second devices to a respective plurality of mating circuit board electrical connections disposed on the top surface of the circuit board, via a respective plurality of solder balls, the respective plurality of solder balls having a respective overall height;

coupling the respective second opposing surfaces of each of the first and second semiconductor devices to first and second respective portions of a sacrificial thermal spreader material, the first and second respective portions each comprising a respective material that is thermally conductive, wherein each respective first and second portion of the sacrificial thermal spreader material comprises top and bottom surfaces, wherein each respective bottom surface is coupled to the respective second surface of the respective semiconductor device; and planarizing at least one of the respective top surfaces of the first and second portions of the sacrificial thermal spreader material, after the first and second portions have been coupled to the respective first and second semiconductor devices, wherein the planarizing is configured to substantially equalize a respective first total height of the first semiconductor device to a respective second total height of the second semiconductor device, while keeping the respective first and second surfaces of each of the first and second semiconductor devices disposed above the top surface of the circuit board;

wherein the first total height is measured, after planarizing, from the top surface of the circuit board to the top surface of the first portion of the sacrificial thermal spreader material, and the second total height is measured, after planarizing, from the top surface of the circuit board to the top surface of the second portion of the sacrificial thermal spreader material.

2. The method of claim 1, further comprising fixedly attaching the first and second semiconductor devices to a top surface of a circuit board along their respective first sides.

3. The method of claim 2, wherein the first and second semiconductor devices are coupled to the circuit board prior to planarizing.

4. The method of claim 1, wherein, after planarizing the first and second portions of sacrificial thermal material, the first total height is substantially coplanar with the second total height to within +/−0.5 mil to +/−1 mil.

5. The method of claim 1, further comprising:
after planarizing at least one of the top surfaces of the first and second portions of thermally conductive material, thermally coupling a substantially planar, thermally conductive first thermal dissipation member to the top surfaces of the first portion of sacrificial thermal spreader material and the second portion of sacrificial thermal spreader material.

6. The method of claim 1, wherein, prior to application of the sacrificial thermal material, a first sub-height of the first semiconductor device, the first sub-height measured from the top surface of the circuit board to the respective second surface of the first semiconductor device, is different from a first sub-height of the second semiconductor device, the second sub-height measured from the top surface of the circuit board to the respective second surface of the second semiconductor device.

7. The method of claim 1, wherein at least one of the first and second portions of the sacrificial thermal spreader material comprises at least one of wafer-grade silicon, silicon carbide, aluminum nitride, gallium nitride, and gallium arsenide.

8. The method of claim 1, wherein the planarizing comprises a wafer-thinning process.

9. An assembly of semiconductor devices, the assembly comprising:
a substrate having a top surface;
a first semiconductor device having corresponding first and second opposing surfaces, at least a portion of the first surface of the first semiconductor device comprising a respective plurality of first electrical connections, wherein the respective plurality of first electrical connections is electrically coupled, via a first respective plurality of solder balls having an overall first solder ball height, to a respective first plurality of mating electrical connections disposed on the top surface of the substrate, wherein the first semiconductor device is coupled to and disposed above the top surface of the substrate, and wherein the first semiconductor device has a first height measured between the first and second opposing surfaces of the first semiconductor device;
a second semiconductor device having corresponding first and second opposing surfaces, at least a portion of the first surface of the second semiconductor device comprising a respective plurality of second electrical connections, wherein the respective plurality of second electrical connections is electrically coupled, via a second respective plurality of solder balls having an overall second solder ball height, to a respective second plurality of mating electrical connections disposed on the top surface of the substrate, wherein the second semiconductor device is coupled to and disposed above the top surface of the substrate, and wherein the second semiconductor device has a second height measured between the first and second opposing surfaces of the second semiconductor device;
a first portion of a first thermal spreader material coupled to the second surface of the first semiconductor device, the first portion having a first thickness, wherein the combination of the first height, the first overall solder ball height, and the first thickness results in a first total height; and
a second portion of a second thermal spreader material coupled to the second surface of the second semiconductor device, the second portion having a second thickness, wherein the combination of the second height, the second overall solder ball height, and the second thickness results in a second total height;
wherein at least one of the first thickness and second thickness has a respective size that is dynamically adjusted, based at least in part on a planarity of the top surface of the substrate, the first height, second height, first overall solder ball height, and second overall solder ball height, to ensure that the first total height and second total height are substantially coplanar.

10. The assembly of claim 9, wherein the first total height and second total height are substantially coplanar within +/−0.5 mil to +/−1 mil.

11. The assembly of claim 9, wherein the first and second thermal spreader materials each comprises a material that has a thermal conductivity high enough to achieve a cooling of at least 10 Watts/meter/degree Kelvin (W/m/° K) predetermined cooling from the first and second semiconductor devices and that has the ability to be planarized to the first and second thicknesses, wherein the first and second thickness each are the minimum thickness required to achieve substantial coplanarity between the first and second total heights.

12. The assembly of claim 9, wherein the first and second thermal spreader materials each comprises at least one of wafer grade silicon, silicon carbide, aluminum nitride, gallium nitride, gallium arsenide, and a metal.

13. The assembly of claim 9, wherein the first and second thickness of the first and second thermal spreader materials are each constructed and arranged to minimize the thermal gap between the respective thermal spreader material, respective corresponding semiconductor device, and substrate, to less than 2 mils.

14. The assembly of claim 9, wherein the second surface of the first semiconductor device has a first shape in the x and y direction and wherein the dimensions of the corresponding first portion of first thermal spreader material are selected to either (a) substantially mate to the first shape or (b) have a shape selected to provide a predetermined thermal compensating effect to the first semiconductor device.

15. The assembly of claim 9, wherein at least one of the first and second thermal spreader materials comprises an electrically conductive material.

16. A system for cooling a plurality of semiconductor integrated circuit (IC) sub-assemblies, the system comprising at least one assembly comprising:
a thermal dissipation member, the thermal dissipation member having an upper surface and a substantially planar lower surface; and
a plurality of sub-assemblies coupled to the lower surface of the thermal dissipation member, at least two of the plurality of sub-assemblies having an upper surface that is coplanar with each other, each respective sub-assembly of the at least two sub-assemblies comprising:
a sub-assembly substrate having a top surface;

a first semiconductor device having corresponding first and second opposing surfaces, at least a portion of the first surface of the first semiconductor device comprising a respective plurality of first electrical connections, wherein the respective plurality of first electrical connections is electrically coupled, via a first respective plurality of solder balls having an overall solder ball height, to a respective first plurality of mating electrical connections disposed on the top surface of the sub-assembly substrate, wherein the first device is coupled to and disposed above the top surface of the sub-assembly substrate and wherein the first semiconductor device has a first height measured between the first and second opposing surfaces of the first semiconductor device;

a second semiconductor device having corresponding first and second opposing surfaces, at least a portion of the first surface of the second semiconductor device comprising a respective plurality of second electrical connections, wherein the respective plurality of second electrical connections are electrically coupled, via a second respective plurality of solder balls having an overall second solder ball height, to a respective second plurality of mating electrical connections disposed on the top surface of the sub-assembly substrate, wherein the second device is coupled to and disposed above the top surface of the sub-assembly substrate and wherein the second semiconductor chip has a second height measured between the first and second opposing surfaces of the second semiconductor device;

a first portion of a first thermal spreader material coupled to the second surface of the first semiconductor device, the first portion having a first thickness, wherein the combination of the first height, the first overall solder ball height, and the first thickness results in a first total height; and a second portion of a second thermal spreader material coupled to the second surface of the second semiconductor device, the second portion having a second thickness, wherein the combination of the second height, the second overall solder ball height, and the second thickness results in a second total height;

wherein at least one of the first total thickness and second total thickness has a respective size that is dynamically adjusted, based at least in part on a planarity of the top surface of the sub-assembly substrate, the first height, the second height, the first overall solder ball height, and the second overall solder ball height, to ensure that the first total height and second total height are substantially coplanar.

17. The system of claim 16, wherein each sub-assembly comprises a daughter card assembly having an upper surface that is substantially coplanar to the upper surfaces of the other respective daughter card assemblies and a corresponding lower surface operably coupled to a motherboard, such that at least a plurality of the daughter card assemblies are all coupled to the motherboard.

18. The system of claim 17, wherein the system comprises a plurality of assemblies, each assembly having first and second opposing surfaces, and wherein at least a portion of the plurality of assemblies are all operably coupled to a thermal dissipation member along their respective first surfaces.

19. The method of claim 1, wherein the planarizing is further configured to adjust a thickness of at least one of the first and second portions of sacrificial thermal material to compensate for variations in one or more of: a planarity of the top surface of the circuit board, the overall height of each respective plurality of solder balls, a first height of the first semiconductor device, as measured between the first and second opposing surfaces of the first semiconductor device, and a second height of the second semiconductor flip chip, as measured between the first and second opposing surfaces of the second semiconductor flip chip.

20. The method of claim 1, wherein at least one of the first and second semiconductor devices comprises a flip chip.

* * * * *